(12) United States Patent
Lee

(10) Patent No.: US 7,851,998 B2
(45) Date of Patent: Dec. 14, 2010

(54) LIGHT EMITTING DEVICE WITH A PROTECTIVE CAP AND METHOD OF FORMING A LIGHT EMITTING DEVICE WITH A PROTECTIVE CAP

(75) Inventor: Jae Hyuk Lee, Gyeongsangbuk-do (KR)

(73) Assignee: LG Electronics Inc., Seoul (KR)

( * ) Notice: Subject to any disclaimer, the term of this patent is extended or adjusted under 35 U.S.C. 154(b) by 356 days.

(21) Appl. No.: 11/709,725

(22) Filed: Feb. 23, 2007

(65) Prior Publication Data
US 2008/0036372 A1 Feb. 14, 2008

(30) Foreign Application Priority Data
Aug. 8, 2006 (KR) .................. 10-2006-0074629

(51) Int. Cl.
*H05B 33/04* (2006.01)
*H05B 33/10* (2006.01)
*H01L 33/54* (2010.01)

(52) U.S. Cl. .................. 313/512; 257/99; 362/632; 445/25

(58) Field of Classification Search .................. 313/512, 313/498–511; 445/25; 257/99, 100; 362/632–634
See application file for complete search history.

(56) References Cited

U.S. PATENT DOCUMENTS

| | | | | |
|---|---|---|---|---|
| 3,843,014 A | * | 10/1974 | Cospen et al. .............. 220/623 |
| 4,204,721 A | * | 5/1980 | Hubert et al. .............. 445/25 |
| 6,081,071 A | * | 6/2000 | Rogers .................. 313/512 |
| 2001/0013756 A1 | * | 8/2001 | Mori et al. .............. 313/512 |
| 2002/0155320 A1 | * | 10/2002 | Park et al. .............. 428/690 |
| 2004/0169466 A1 | * | 9/2004 | Suehiro et al. .............. 313/512 |
| 2004/0185301 A1 | * | 9/2004 | Tsuchiya et al. .............. 428/690 |
| 2006/0291245 A1 | * | 12/2006 | Shimada .................. 362/612 |

FOREIGN PATENT DOCUMENTS

| | | |
|---|---|---|
| JP | 2006-40660 | 2/2006 |
| KR | 2001-0079019 | 8/2001 |
| KR | 2003-0067145 | 8/2003 |
| KR | 10-2004-0071482 | 8/2004 |
| KR | 2004079019 A * | 9/2004 |
| WO | WO 2005057082 A1 * | 6/2005 |

OTHER PUBLICATIONS

Han et al., machine translation of KR2004-079019, Sep. 2004.*
Korean Notice of Allowance dated May 4, 2007 and English language translation.

* cited by examiner

*Primary Examiner*—Nimeshkumar D Patel
*Assistant Examiner*—Steven Horikoshi
(74) *Attorney, Agent, or Firm*—KED & Associates, LLP (57) ABSTRACT

Embodiments of the present invention may provide a light emitting device that include a substrate, a pixel portion on the substrate and a metal cap to enclose the pixel portion between the metal cap and the substrate.

25 Claims, 13 Drawing Sheets

LIGHT EMITTING DEVICE WITH A PROTECTIVE CAP AND METHOD OF FORMING A LIGHT EMITTING DEVICE WITH A PROTECTIVE CAP

This application claims priority from Korean Patent Application No. 2006-0074629, filed Aug. 8, 2006, the subject matter which is incorporated by reference.

BACKGROUND

1. Field

Embodiments of the present invention may relate to a light emitting device and/or a method of forming a light emitting device.

2. Background

A light emitting device used in a flat panel display may use light emitted by electron-hole recombination. The light emitting device may have advantages as compared to other types of flat panel displays. These advantages may include a relatively fast response time and/or a relatively low power consumption. Because the light emitting device does not require a backlight unit, a light emitting device (and/or devices using a light emitting device) may be light in weight.

An organic light emitting device (OLED) may include an electron injection electrode, a hole injection electrode and an emitting layer. The emitting layer may be made from an organic compound formed between the electron injection electrode and the hole injection electrode. When an injecting electron charges into the emitting layer, the injected electron and the injected hole may be paired together. The extinction of the injected hole-electron pair may result in electroluminescence.

Functionality of the light emitting device may deteriorate due to external air containing moisture, oxygen and ultraviolet rays, external forces on the device during manufacturing and/or a usage environment of the device. More specifically, external moisture and oxygen may oxidize a pixel portion containing organic matter and may be a cause of deterioration and damage of the pixel portion that causes the device to stop functioning or reduce operations. An encapsulation structure may be needed to protect the pixel portion.

BRIEF DESCRIPTION OF THE DRAWINGS

Arrangements and embodiments may be described with reference to the following drawings in which like reference numerals refer to like elements and wherein.

DETAILED DESCRIPTION

Figure 1:
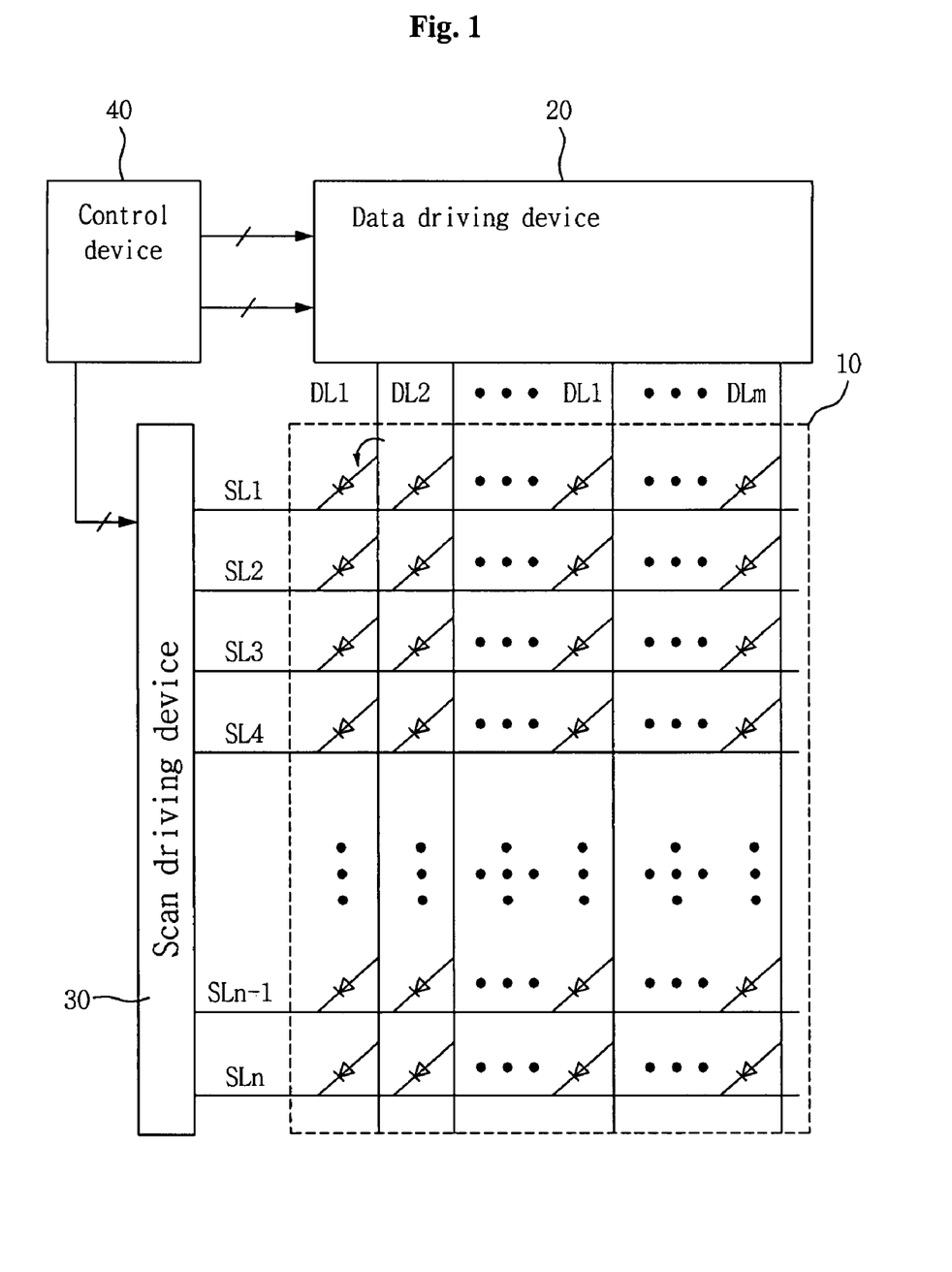
FIG. 1 is a block diagram of a display apparatus according to an example arrangement.

FIG. 1 is a block diagram of a display apparatus according to an example arrangement. Other arrangements may also be provided such as, for example, in U.S. patent application Ser. No. 10/858,387 (Publication No. 2004-222749), Ser. No. 11/318,515 (Publication No. 2006-146827) and Ser. No. 11/289,644 (Publication No. 2006-119256), Publication Nos. 2006/0262049, 2006/0146827, 2006/0139262, and 2006/0055632, etc, whose entire disclosures are incorporated herein by reference. A display apparatus may be used in or formed as a rigid or flexible display for electronic books, newspapers, magazines, etc. The display apparatus may also be used in various types of portable devices (e.g., handsets, MP3 players, notebook computers, etc.), audio applications, navigation applications, televisions, monitors, or other types of devices that use a display, either monochrome or color.

FIG. 1 shows that the display apparatus may include a panel 10, a data driving device 20, a scan driving device 30 and a control device 40. The panel 10 may also include a plurality of pixels 50 formed in cross areas of data lines (DL1 to DLm) and scan lines (SL1 to SLn).

Figure 2:
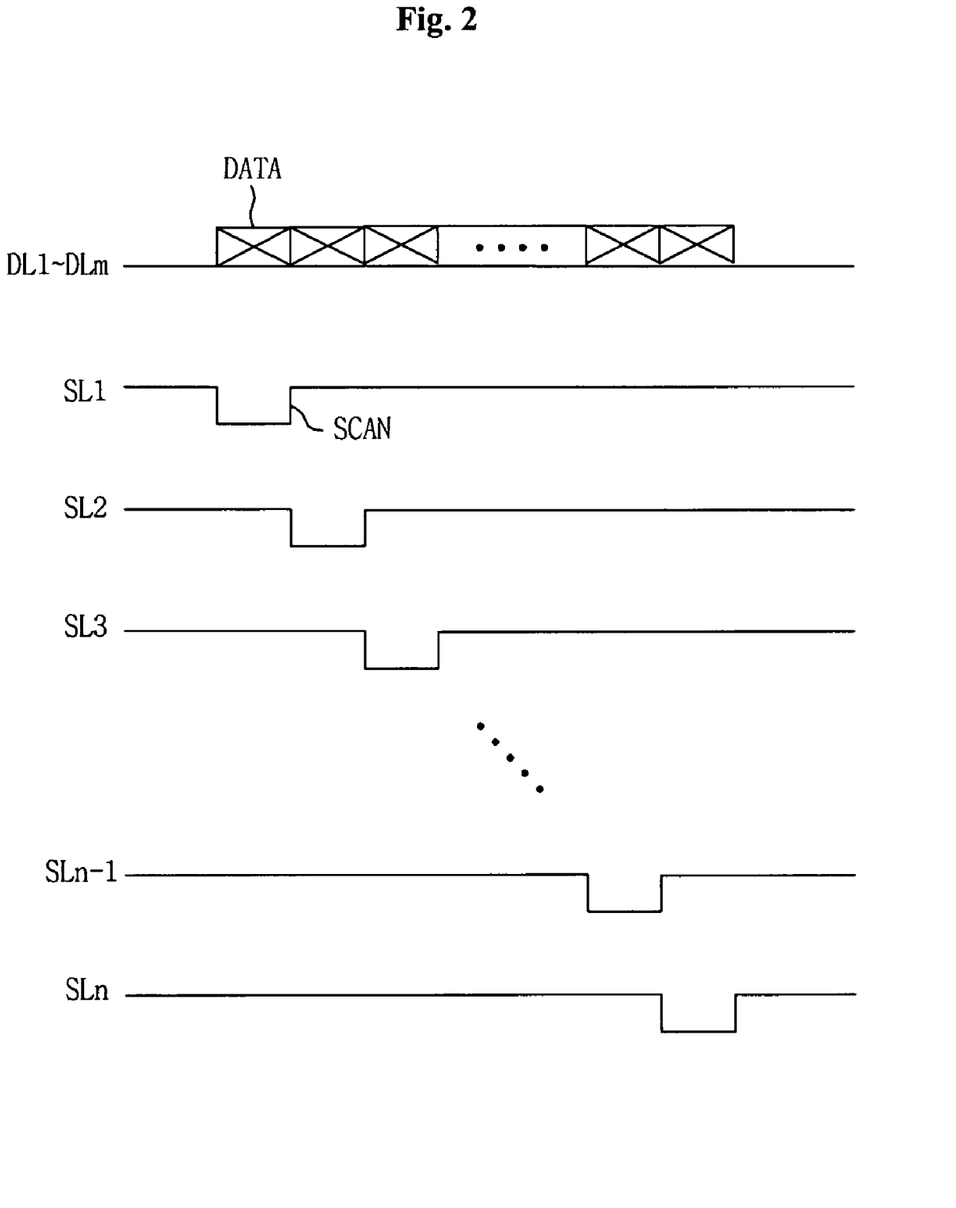
FIG. 2 is a timing diagram showing one example of scan signals being applied to scan lines according to an example arrangement.

The scan driving device 30 may transmit scan signals in sequence to the scan lines (SL1 to SLn). The data driving device 20 may transmit data signals in sequence to the data lines (DL1 to DLm). The data driving device 20 may use a pulse amplitude modulation (PAM) method or a pulse width modulation (PWM) method, for example, to apply the data signals to the data lines (DL1 to DLm). For example, FIG. 2 is a timing diagram showing one example of scan signals being applied to the scan lines by the scan driving device 30 and data signals being applied to the data lines by the data driving device 20.

Figure 3:
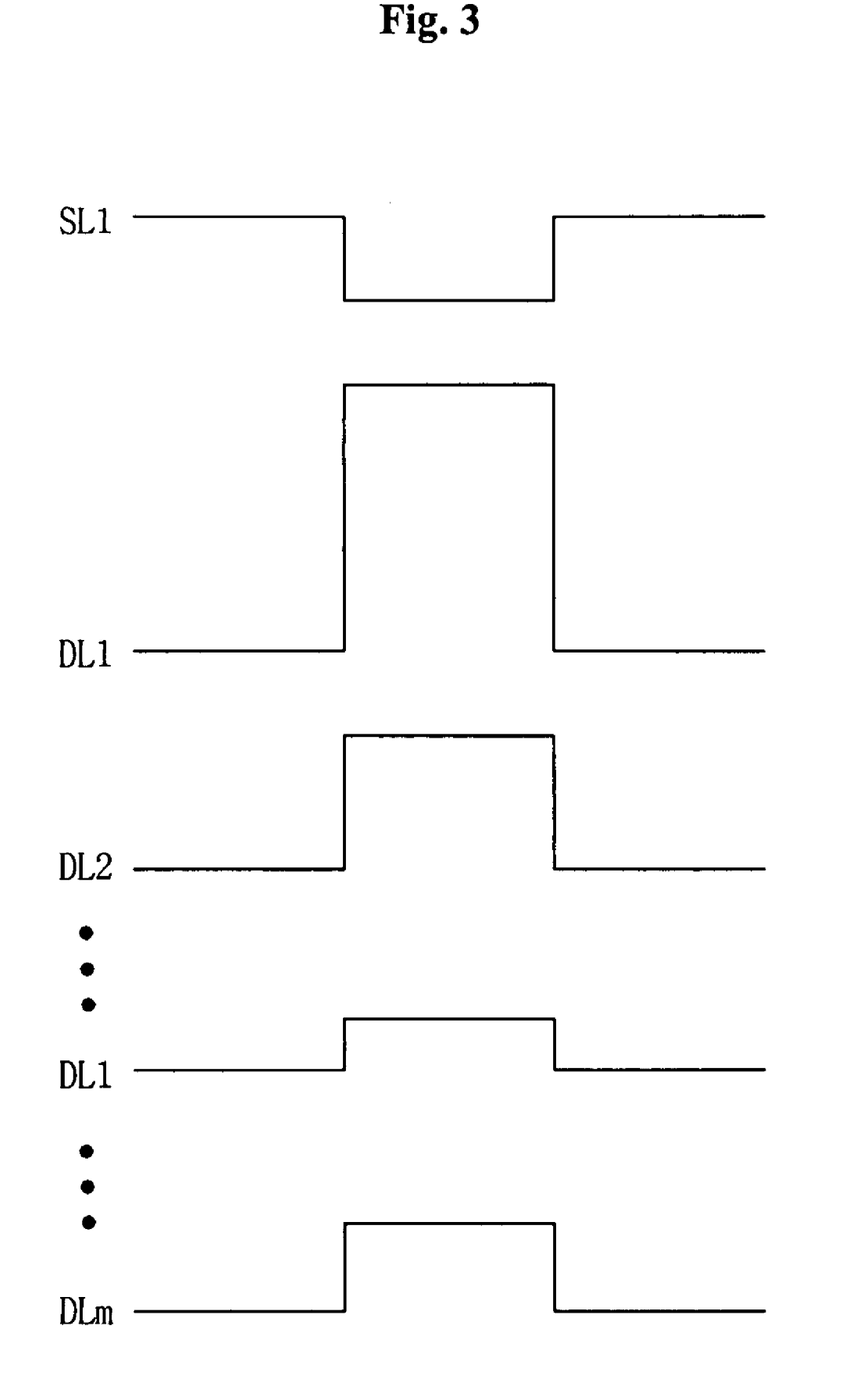
FIG. 3 is a timing diagram showing a method of driving a panel using a pulse amplitude modulation (PAM) method.

FIG. 3 is a timing diagram showing a method of driving the panel 10 using a PAM method. The data driving device 20 may apply data signals (i.e., data current corresponding to the digital video data) to the data lines (DL1 to DLm) by using the PAM method. In the PAM method, a gray scale of the pixels may be proportionate to an amplitude of the data current. In the data current, a time to have high logic may be constant irrespective of the gray scale corresponding to the digital video data. Other driving methods are disclosed in U.S. patent application Ser. No. 11/318,515 (Publication No. 2006-146827), U.S. Publication No. 2005/0151707, U.S. Publication No. 2006/0146827, etc., whose entire disclosures are incorporated herein by reference.

Figure 4:
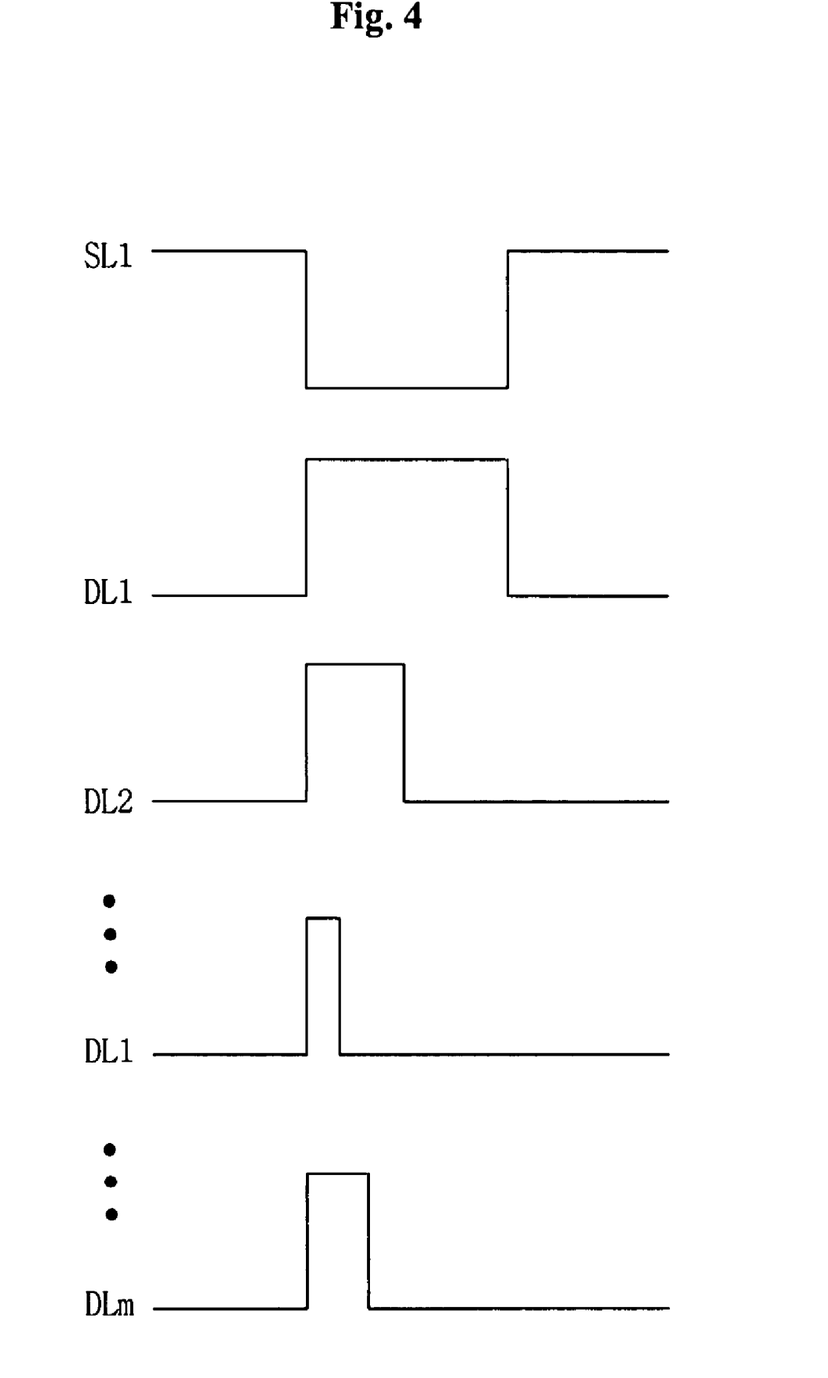
FIG. 4 is a timing diagram showing a method of driving a panel using a pulse width modulation (PWM) method.

FIG. 4 is a timing diagram showing a method of driving the panel 10 using a PWM method. The data driving device 20 may apply data signals (i.e., data current corresponding to the digital video data) to the data lines PL1 to DLm) by using the PWM method. In the PWM method, a gray scale of the pixels may be proportionate to a time of high logic in the data current. The amplitude of the data current may be constant irrespective of the gray scale corresponding to the digital video data. Other driving methods are disclosed in U.S. patent application Ser. No. 11/318,515 (Publication No. 2006-146827), U.S. Pat. No. 7,119,733, U.S. Pat. No. 6,914,388, etc., whose entire disclosure is incorporated herein by reference.

The data driving device 20 may use either a PAM current generating circuit and/or a PWM current generating circuit to drive the panel 10 depending on a gray scale level of an image signal as detected by the control device 40. When image signals having a relatively high gray scale level are to be displayed, the PAM method may be used to minimize power consumption. When image signals having a relatively low gray scale level are to be displayed, the PWM method may be used to ensure that good image quality is maintained. Other methods may also be used.

Figure 5:
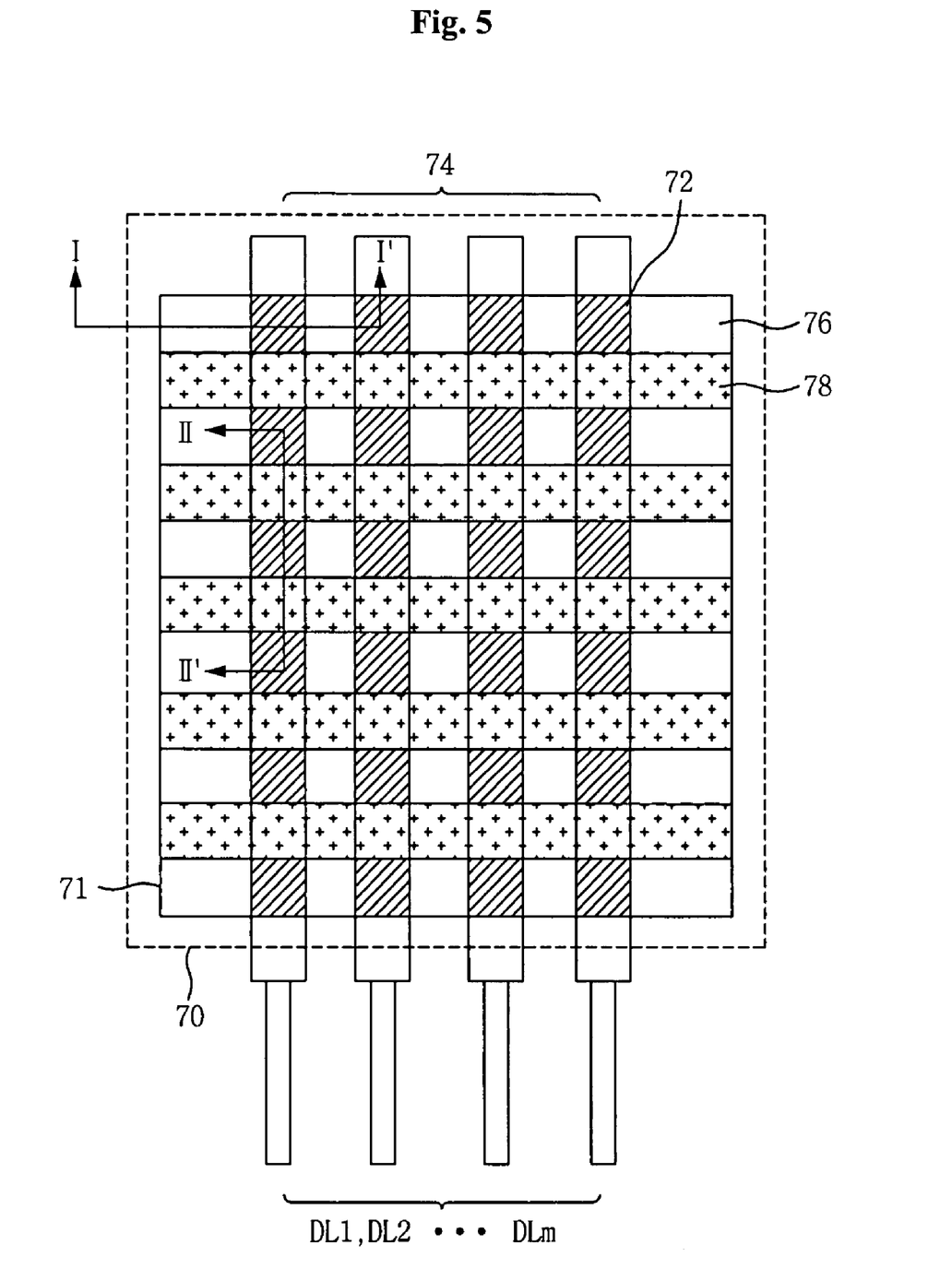
FIG. 5 shows a panel according to an example arrangement.

FIG. 5 shows a structure of a panel 10 according to an example arrangement. Other arrangements may also be used such as, for example, as illustrated in U.S. Pat. No. 6,897,471, whose entire disclosure is incorporated herein by reference. More specifically, FIG. 5 shows a panel 70 corresponding to the panel 10 shown in FIG. 1. The panel 70 may include a cell section 71 containing a plurality of sub-pixels 72 (e.g., light emitting areas), anode electrode layers (or anode electrodes or data electrodes) 74, cathode electrode layers (or cathode electrodes or scan electrodes) 76 and walls 78. The sub-pixels 72 may be formed in cross areas of the anode electrode layers 74 and the cathode electrode layers 76.

The anode electrode layers 74 may serve as positive electrodes and the cathode electrode layers 76 may serve as negative electrodes. The walls 78 may be made of an insulating material to separate the cathode electrode layers 76 so that the cathode electrode layers 76 are not short-circuited.

The data lines DL1, DL2 . . . DLm may be conductors that are coupled to the anode electrode layers 74. Scan lines (not shown in FIG. 5) may be coupled to the cathode electrode layers 76. As one example, first scan lines may be connected to odd number cathode electrode layers and second scan lines may be connected to even number cathode electrode layers.

Figure 6:
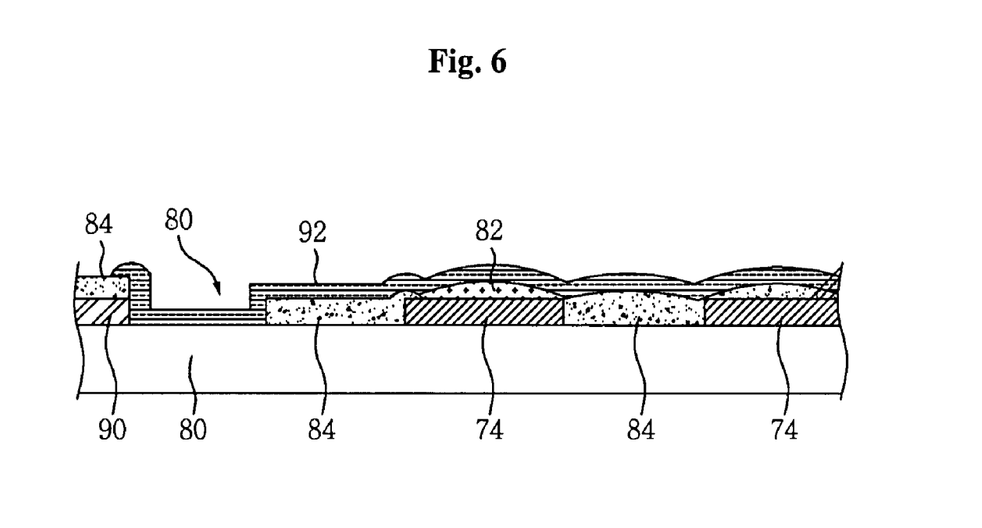
FIG. 6 is a side view of the panel according to an example arrangement.
Figure 7:
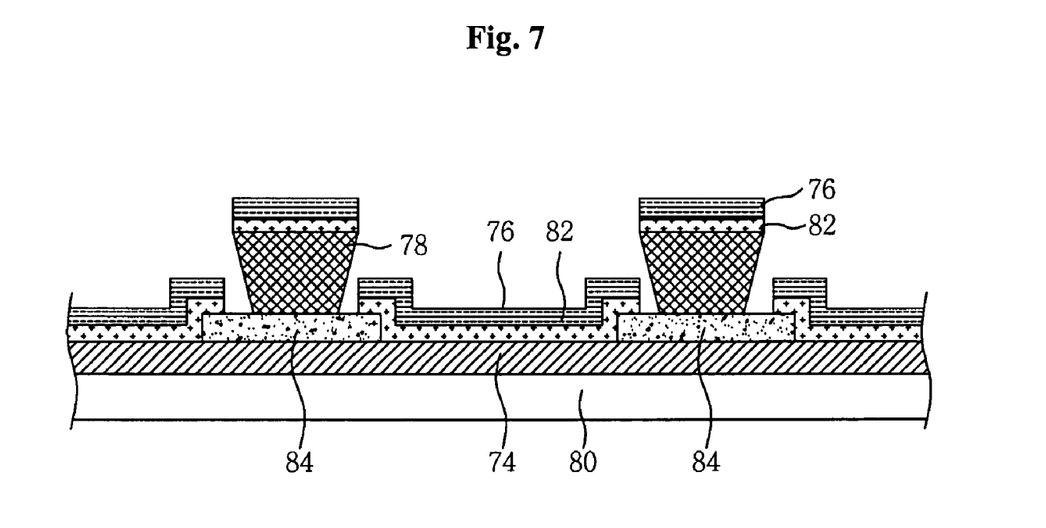
FIG. 7 is a side view of the panel according to an example arrangement.

FIGS. 6 and 7 are side views of an electroluminescent panel according to an example arrangement. More specifically, FIG. 6 is a sectional view taken along line I-I' of FIG. 5 and FIG. 7 is a sectional view taken along line II-II' of FIG. 5. Other arrangements may also be used.

FIG. 6 shows a substrate 80 having the anode electrode layers 74 and light emitting layer (or layers) 82 formed thereon in sequence. Each of the light emitting layers 82 may include an emitting layer made of organic or inorganic material corresponding to red, green or blue light.

An insulating layer 84 (or layers) may be formed on areas of the substrate 80 other than the light emitting areas and a contact hole section 88. The insulating layer 84 may prevent a short from occurring between the anode electrode layers 74. A scan line 90 may be connected to the contact hole section 88.

A metal layer 92 may be formed on the substrate 80 over the anode electrode layers 74, the insulating layer 84, the light emitting layer 82 and the scan line 90. The metal layer 92 may be connected to the scan line 90 through the contact hole section 88. The cathode electrode layers 76 (not shown in FIG. 6) may be connected to the scan line 90 through the contact hole section 88.

FIG. 7 shows that the anode electrode layer 74, the light emitting layer 82 and the cathode electrode layer 76 may be formed in sequence on the substrate 80. In addition, the insulating layers 84 and the wall 78 may be formed in sequence on the anode electrode layer 74.

Figure 8:
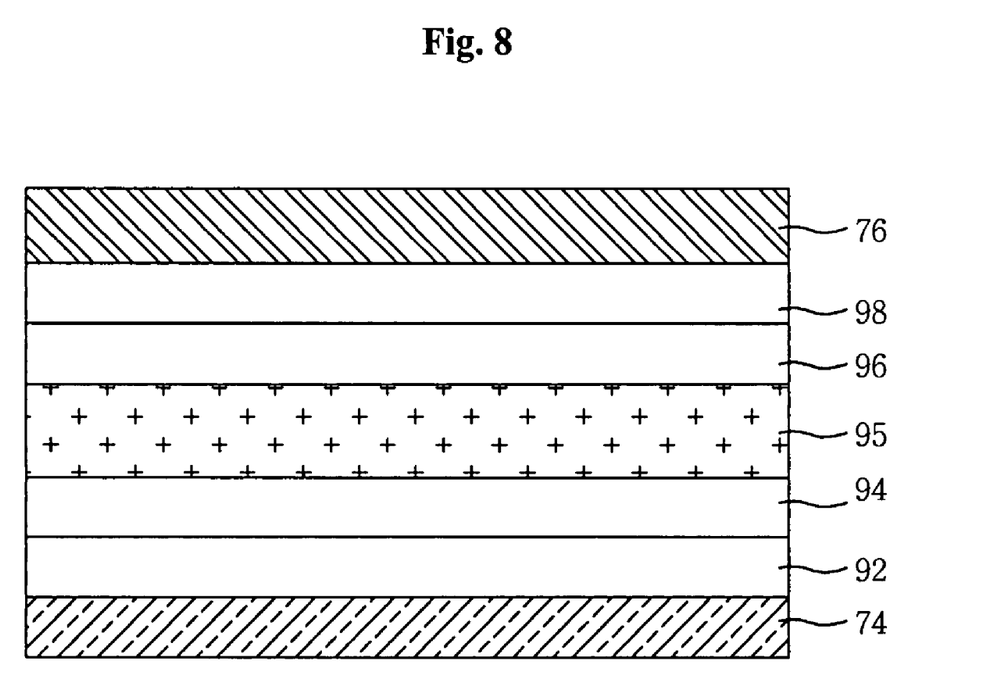
FIG. 8 shows an organic electroluminescent (EL) device according to an example arrangement.

FIG. 8 shows details of the light emitting device, e.g., an organic electroluminescent device, according to an example arrangement. Other arrangements may also be used such as, for example, as illustrated in U.S. Pat. Nos. 6,579,629, 6,614,176 and 6,803,123 and U.S. patent application Ser. No. 11/102,358 (Publication No. 2006-226767), etc., whose entire disclosures are incorporated herein by reference. The plurality of layers shown in FIG. 8 correspond to the light emitting layer 82 shown in FIGS. 6-7. More specifically, the device includes a hole injecting layer (HIL) 92 formed on the anode electrode 74, a hole transporting layer (HTL) 94 formed on the HIL 92, an organic electroluminescent layer 95 formed on the HTL 94, an electron transporting layer (ETL) 96 formed on the HTL 94 and an electron injecting layer (EIL) 98 formed on the ETL 96. The cathode electrode layer 76 may be formed on the ETL 96. One or more of the HIL, HTL, ETL and EIL may be omitted, depending on the particular device structure adopted. Further, an inorganic electroluminescent device may be used.

Still further, depending on the materials used for the cathode electrode, the anode electrode and/or the substrate, the electroluminescent device may emit light through a transparent cathode, or through a transparent anode and the substrate, or through both (i.e., bi-directional).

Arrangements and embodiments will now be described in more detail with respect to FIGS. 9-14.

Figure 9:
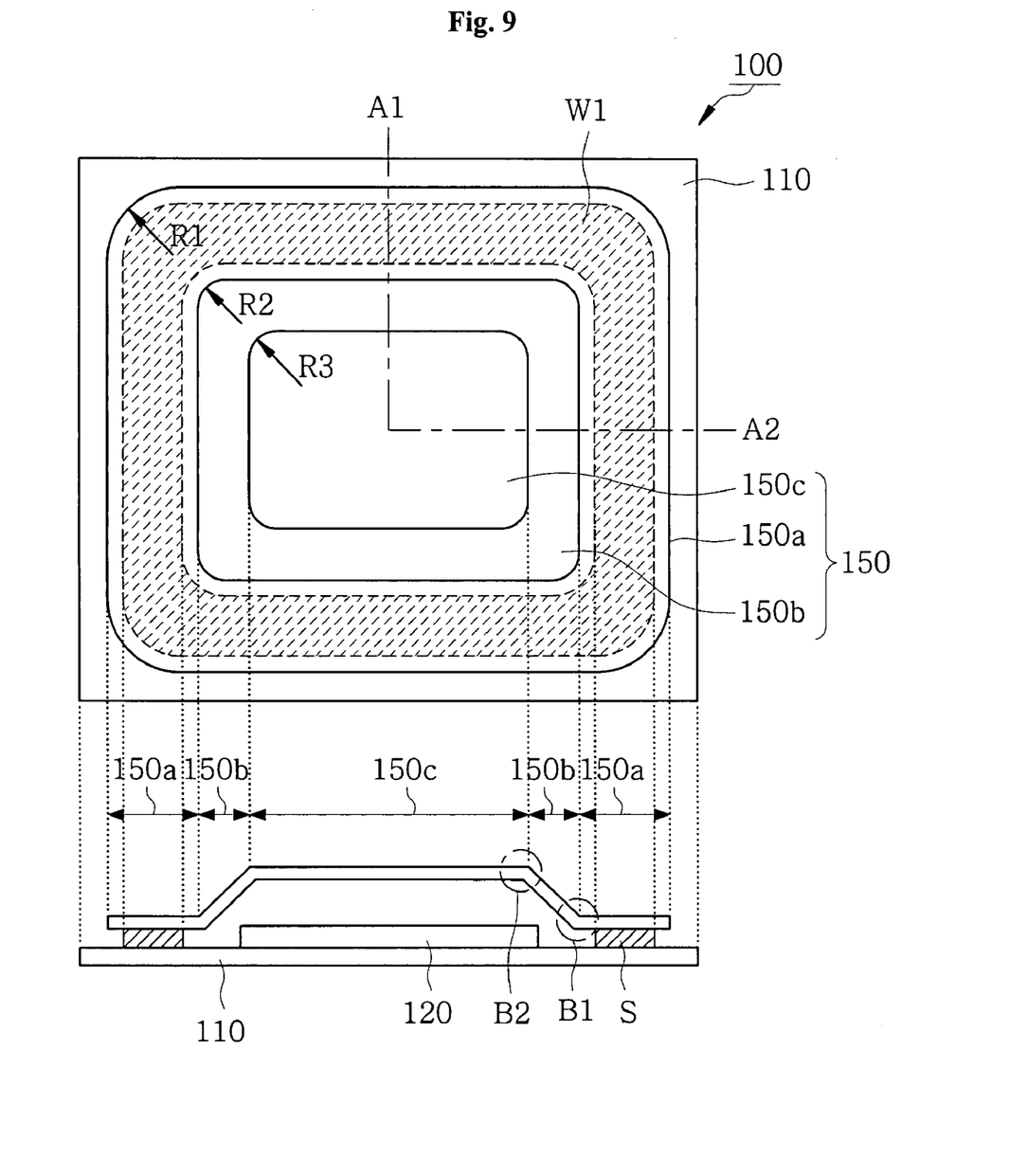
FIG. 9 is plane and sectional view of a light emitting device according to an example arrangement.
Figure 10:
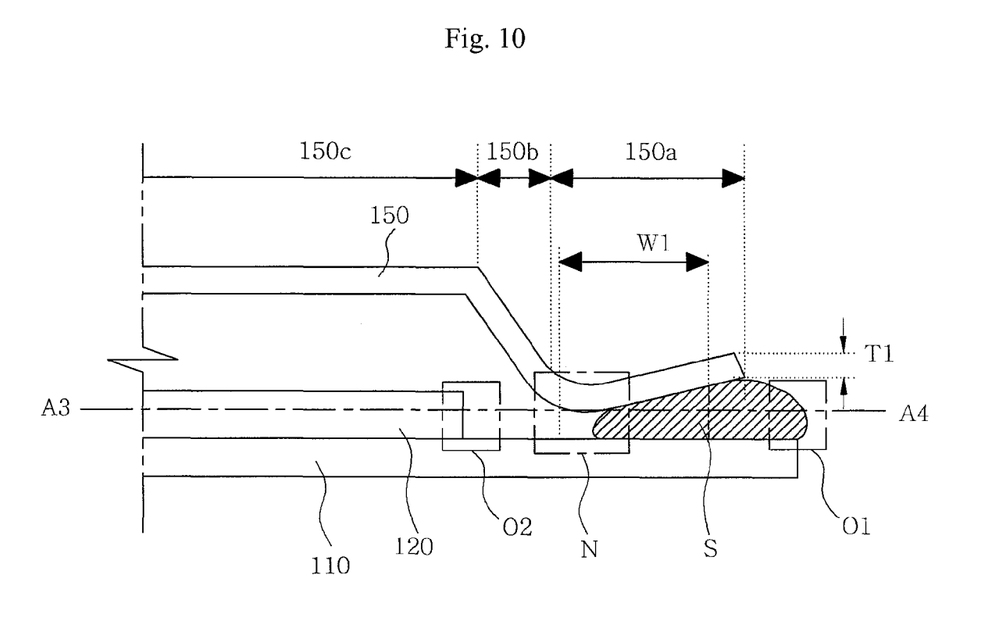
FIG. 10 is a partial sectional view taken along line A1-A2 of FIG. 9.
Figure 11:
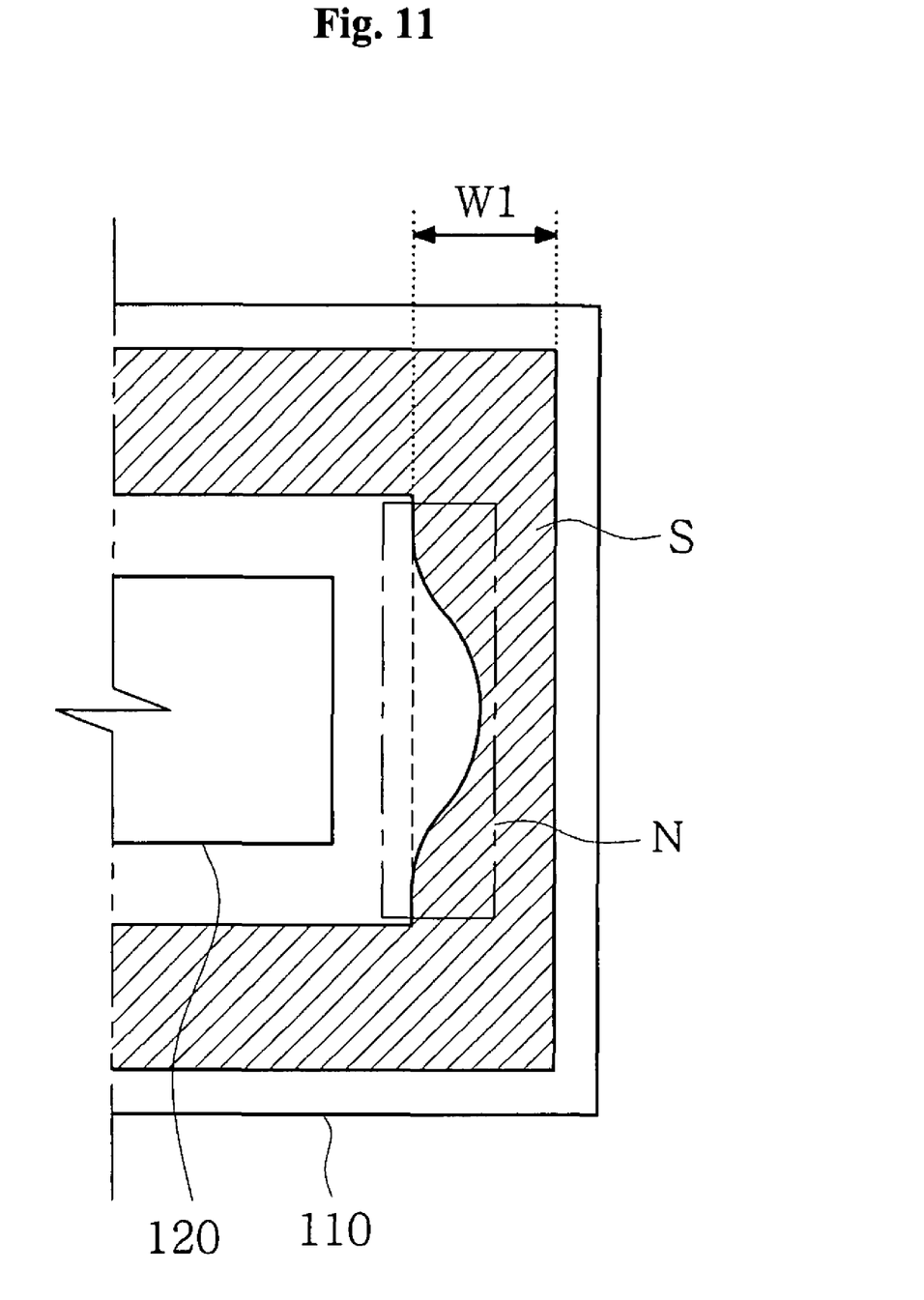
FIG. 11 is a sectional view taken along line A3-A4 of FIG. 10.

As shown in FIGS. 9-11, a light emitting device 100 may include an active area 120 (or a pixel portion) that includes a light emitting layer formed between two electrodes. The light emitting device may be formed on a substrate 110.

A protection portion such as a metal cap 150 may cover the active area 120. The metal cap 150 may be sealed to the substrate 110 with a sealant (S).

The metal cap 150 may include a first surface 150a, a second surface 150c and an inclination surface 150b. The first surface 150a may include a sealing area (W1) that is sealed with a sealant (S) in a partial area corresponding to an outer area of a frame of the active area 120. The second surface 150c may protrude in a direction apart from the substrate 110 based on the first surface 150a in an inner area of the sealing area (W1) of the first surface 150a. The first surface 150a may extend to the second surface (150c) via the inclination surface 150b.

A radius of curvature R1 of a corner of the first surface 150a, a radius of curvature R2 of a corner of the frame where the inclination surface 150b meets (or adjoins) with the first surface 150a and a radius of curvature R3 of a corner of the second surface 150c may be formed to have sizes close (or substantially close) to each other. As is known to one skilled in the art, a radius of curvature of a curve at a point (such as at a corner) may correspond to a radius of a virtual oscillating circle at that point.

The metal cap 150 may be manufactured to have a thin thickness (T1), a small size and a light weight. However, if the thickness (T1) of the metal cap 150 becomes too thin, the metal cap 150 may be significantly influenced by residual stresses and a restoring force acting on areas B1 and B2 where the first and second surfaces 150a and 150b meet (or adjoin) with the inclination surface 150b. As a result, distortion of the metal cap 150 may occur.

Additionally, a flat degree of the sealing area (W1) may deteriorate based on distortion of the metal cap 150. Therefore, as shown in area N of FIG. 11, the sealant (S) may be partially pushed from the sealing area (W1) and an encapsulating status of the light emitting device 100 may deteriorate. In other words, a seal neck at the area N may deteriorate during the sealing of the substrate 110 and the metal cap 150.

The sealant may also flow over a circumference of the sealing area (W1). As a result, a production yield may deteriorate due to scribing failure in area O1 or damage of the pixel portion 120 in area O2.

Embodiments of the present invention may provide a light emitting device that can solve (or minimize) deterioration of the seal neck and/or the seal overflow.

Figure 12:
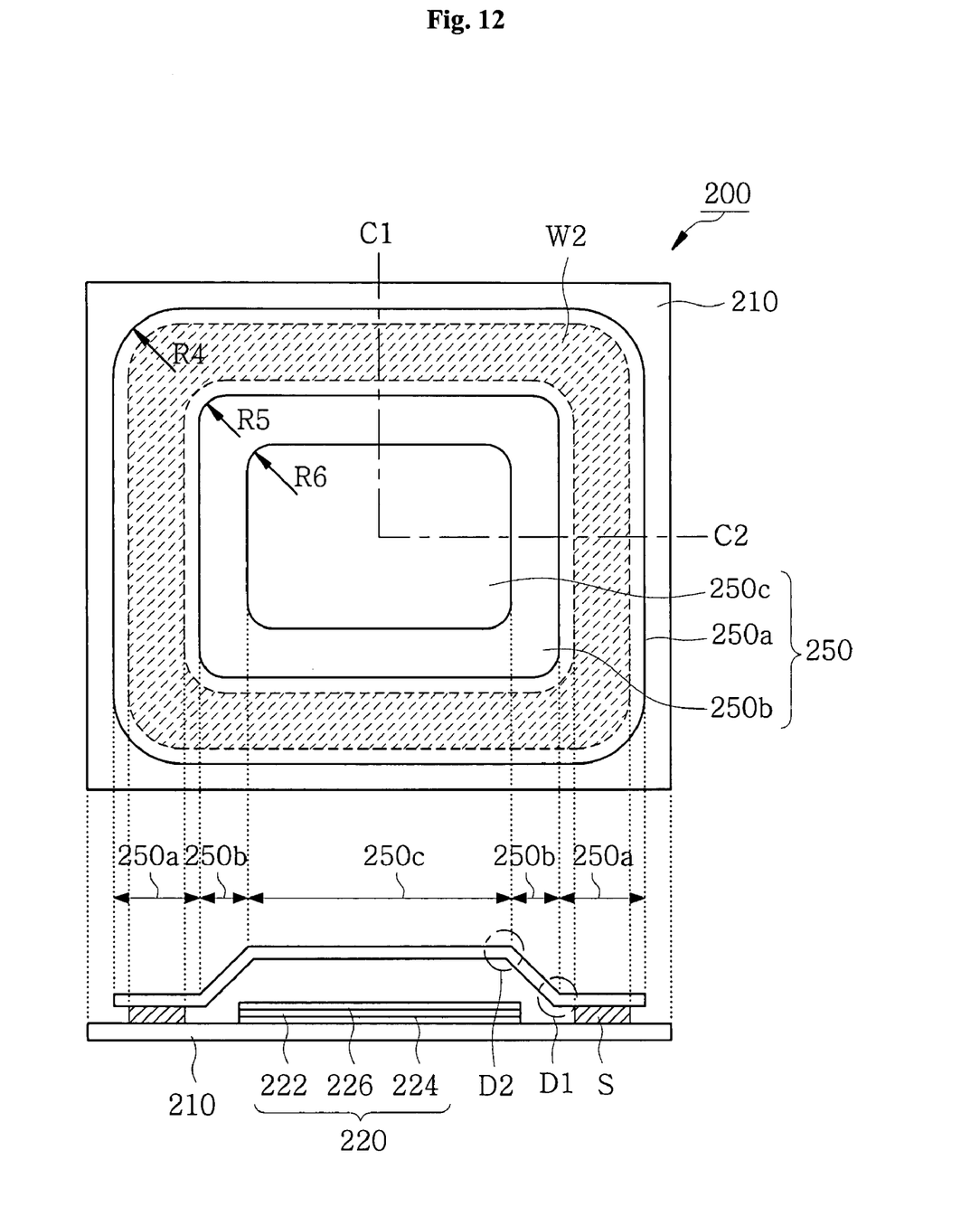
FIG. 12 is plane and sectional view of a light emitting device according to an example embodiment of the present invention.
Figure 13:
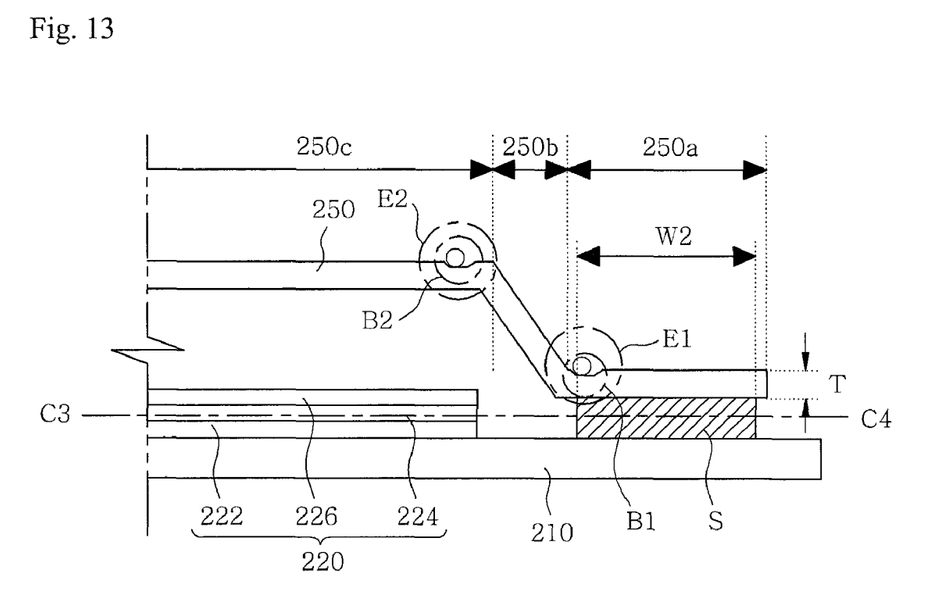
FIG. 13 is a partial sectional view taken along the line C1-C2 of FIG. 12.
Figure 14:
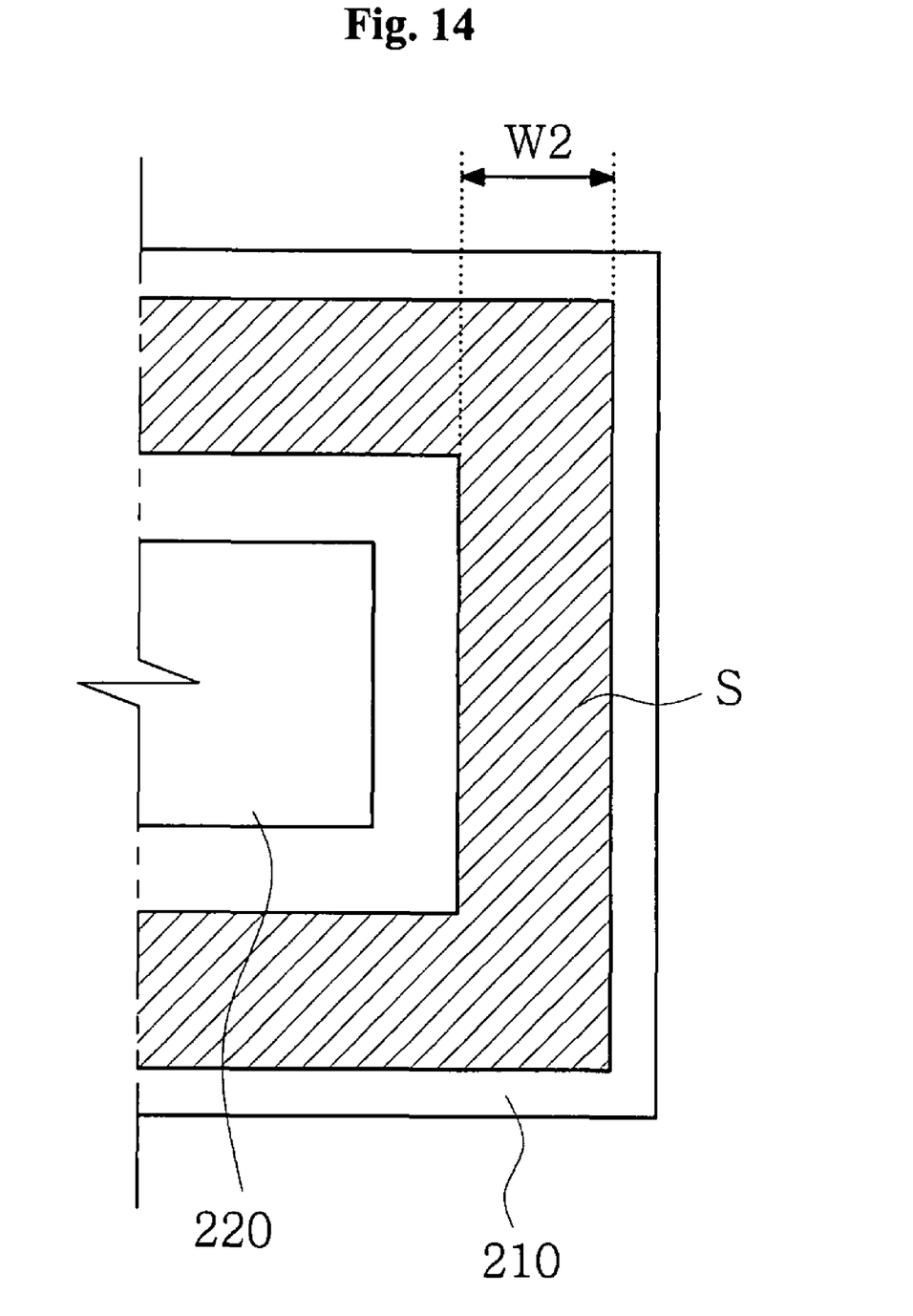
FIG. 14 is a sectional view taken along line C3-C4 of FIG. 13.

FIG. 12 is plane and sectional view of a light emitting device according to an example embodiment of the present invention. FIG. 13 is a partial sectional view taken along line C1-C2 of FIG. 12. FIG. 14 is a sectional view taken along line C3-C4 of FIG. 13. Other embodiments and configurations are also within the scope of the present invention.

As shown in FIGS. 13-14, a light emitting device 200 may include an active area 220 (or pixel portion) formed on a substrate 210. The active area 220 may include a first electrode 222, a second electrode 226 and a light emitting layer 224 formed between the first electrode 222 and the second electrode 226. The first electrode 222 may be patterned with transparent conductive films such as ITO and IZO, each of which may have a relatively high work function.

The light emitting layer 224 may be formed on the first electrode 222. The light emitting layer 224 may be formed of an organic matter. The light emitting layer 224 may include any one or more of red, green and blue light emitting layers, or a combination thereof.

The second electrode 226 may be formed on the light emitting layer 224. The second electrode 226 may be formed of any one or more of Al, Ag and Mg and may have a relatively low work function. If the second electrode 226 is a top-emission type, then the second electrode 226 may be formed as a transfer electrode by applying a thin metal electrode or by applying a thin metal and a transparent conductive film.

A hole injection/transfer layer (not shown) for smoothly transporting the hole may also be provided between the first electrode 222 and the light emitting layer 224. An electron injection/transfer layer (not shown) may also be provided between the light emitting layer 224 and the second electrode 226.

A metal cap 250 (or protective cap) may be sealed on the substrate 210 with a sealant (S) to protect the active area 220. The metal cap 250 may be formed in two processes, for example. However, embodiments are not limited thereto. That is, the metal cap 250 may be formed in three processes to include a moisture absorbing material.

The metal cap 250 may be formed to have a thickness (T2) of 0.2 mm to 0.3 mm in view of the small size and light weight of the light emitting device 200. The metal cap 250 may protect against an external force that may act on the device. A lighter and thinner device may be provided when the metal cap 250 has a thickness of less than 0.3 mm. Other thicknesses of the metal cap 250 are also within the scope of embodiments of the present invention.

The metal cap 250 may include a first surface 250a, a second surface 250c and an inclination surface 250b that connects the first surface 250a and the second surface 250c. Embodiments of the present invention may also include other surfaces. The inclination surface 250b may also be referred to as a connecting portion.

The first surface 250a may include a sealing area W2 that is sealed with the sealant (S) in a partial area corresponding to an outer area of a frame of the pixel portion 220.

The second surface 250c may protrude in a direction away from the substrate 210 based on the first surface 250a in an inner area of the sealing area W2 of the first surface 250a.

A radius of curvature R5 of a corner (at area D1) of the frame where the first surface 250a meets (or adjoins) with the inclination surface 250b and a radius of curvature R6 of a corner (at area D2) of the second surface 250c may be smaller than a radius of curvature R4 of a corner of the first surface 250a of the frame to thereby reduce an influence of residual stress and restoring force. As is known to one skilled in the art, a radius of curvature of a curve at a point (such as at a corner) may correspond to a radius of a virtual oscillating circle at that point.

Table 1 shows a change of a flat degree of the sealing area W2 of the metal cap 250 according to a size change of the radiuses of curvature R4, R5 and R6. The term "flat degree" may correspond to a difference between a highest part and a lowest part of the first surface 250a of the metal cap 250.

TABLE 1

| Thickness of metal cap (T2) (mm) | R4 (mm) | R5 (mm) | R6 (mm) | Flat degree (μm) |
|---|---|---|---|---|
| 0.2 | 1.0 | 1.0 | 1.0 | 49 |
| 0.2 | 1.0 | 0.7 | 0.7 | 35 |
| 0.2 | 1.0 | 0.5 | 0.5 | 25 |
| 0.2 | 1.0 | 0.2 | 0.2 | 20 |

Table 1 shows that the flat degree of the first surface 250a decreases as the radiuses of curvature R5 and R6 of the corners of the inclination surface 250b and the second surface 250c decreases. This may be because the residual stress and restoring force acting on the areas D1 and D2 are reduced as the radiuses of curvature R5 and R6 of the corners of the inclination surface 250b and the second surface 250c become smaller. The distortion degree of the metal cap 250 may thereby be reduced.

The radiuses of curvature R5 and R6 of the corners of the inclination surface 250b and the second surface 250c may be formed to have a size of more than 0.2 mm. The size may be a limit value that may be realized by a press. This may be because when the radiuses of the curvature R5 and R6 of the corners of the inclination surface 250b and the second surface 250c are formed to be less than 0.2 mm, the manufacturing process may be influenced by errors, residual stress and restoring force to thereby deteriorate the production yield.

When the radius of curvature R6 of the corner (at area D2) of the second surface 250c is less than 0.2 mm (i.e., less than half of the radius of curvature R4 of the corner of the first surface 250a (0.2 mm≦R6≦½R4)), the flat degree may be reduced by approximately 50% as compared to when the radius of curvature R6 of the corner of the second surface 250c is 1.0 mm. The flat degree of 0 μm to 25 μm is a process yield condition to prevent (or reduce) seal neck deterioration and seal overflow and thereby improve the production yield.

The radiuses of curvature R5 and R6 of the corners of the inclination surface 250b and the second surface 250c may be more than 0.2 mm and less than ½ of the radius of curvature R4.

By having the range of size, the radiuses of curvature R5 and R6 of the corners of the inclination surface 250b and the second surface 250c may minimize the influence of residual stress and restoring force on the metal cap 250. This may prevent distortion of the sealing area W2 of the metal cap 250. Therefore, the light emitting device 200 according to an example embodiment of the present invention may solve a problem of seal neck or seal overflow due to distortion of the sealing area W2.

The radius of curvature R5 of the corner of the frame where the first surface 250a meets (or adjoins) with the inclination surface 250b may be the same as (or similar to) the radius of curvature R6 of the corner of the second surface 250c. Also, since the radius of curvature of the corner of the inclination surface 250*b* is based on the radiuses of curvature R5 and R6, the radius of curvature of the corner of the inclination surface 250*b* may be the same as the radius of curvature R6 of the corner of the second surface 250*c*.

A groove B1 of a predetermined size may be formed by a press on a partial area E1 on the first surface 250*a* adjacent to the frame where the inclination surface 250*b* adjoins the first surface 250*a*, as shown in FIGS. 13 and 14.

A groove B2 of a predetermined size may be formed by a press in a partial area E2 on the second surface 250*c* adjacent to the frame where the inclination surface 250*b* adjoins the second surface 250*c*.

Portions of the grooves B1 and B2 may be curve shaped and/or each of the grooves B1 and B2 may have a predetermined depth. Other structures, sizes and/or methods of forming may also be used.

The groove B1 formed on the first surface 250*a* may surround the frame where the inclination surface 250*b* adjoins (or meets) the first surface 250*a*. The groove B2 formed on the second surface 250*c* may surround the frame where the inclination surface 250*b* adjoins (or meets) the second surface 250*c*.

The grooves B1, B2 formed on the upper surfaces of the first surface 250*a* and the second surface 250*c* may improve strength of the partial areas E1 and E2 on the first and second surfaces 250*a* and 250*c* that meet (or adjoin) with the inclination surface 250*b*. This may minimize the influence of residual stress and restoring force acting on the metal cap 250. Therefore, the light emitting device 200 according to an example embodiment of the present invention may prevent (or minimize) distortion that may occur in each part of the metal cap 250 based on the partial areas E1 and E2 of the first and second surfaces 250*a* and 250*c* of the metal cap 250. Other shapes may also be used other than the grooves B1 and B2.

While the structure of the pixel portion 220 may be explained with reference to the first electrode 222 being an anode and the second electrode 226 being a cathode, embodiments of the present invention are not limited thereto.

Additionally, the light emitting device (not shown) according to an example embodiment of the present invention may be a light emitting device of an active matrix that includes a driving thin film transistor (TFT) connected to the first electrode 222.

According to an example embodiment of the present invention, although the protection portion is a metal, the protection portion may also include caps of various materials having elasticity and plastic deformation. Embodiments of the present invention are not limited to a metal cap.

The light emitting layer in the pixel portion may contain any one or more of an organic matter and an inorganic matter.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a substrate;
    an active area on the substrate, the active area including a first electrode, a light emitting layer and a second electrode;
    a protective cap to seal with the substrate so as to cover the first electrode, the second electrode and the light emitting layer, the protective cap including a first surface, a second surface and a connecting surface to adjoin the first surface and the second surface, wherein a first radius of curvature of a corner of the first surface is greater than a second radius of curvature of a corner where the first surface adjoins the connecting surface, and the first radius of curvature is greater than a third radius of curvature of a corner where the second surface adjoins the connecting surface,
    wherein the first surface, the second surface and the connecting surface substantially have a same thickness, and
    wherein the first radius of curvature, the second radius of curvature and the third radius of curvature are radii of curvature on a plane that is substantially parallel to a surface of the substrate on which the active area is formed.

2. The light emitting device of claim 1, wherein the second radius of curvature is greater than 0.2 mm.

3. The light emitting device of claim 2, wherein the second radius of curvature is less than one-half of the first radius of curvature.

4. The light emitting device of claim 1, wherein the third radius of curvature is greater than 0.2 mm.

5. The light emitting device of claim 4, wherein the third radius of curvature is less than one-half of the first radius of curvature.

6. The light emitting device of claim 1, wherein the protective cap includes a first groove at a first area where the connecting surface adjoins one of the first surface or the second surface.

7. The light emitting device of claim 6, wherein the protective cap further includes a second groove at a second area where the connecting surface adjoins the other one of the first surface or the second surface.

8. The light emitting device of claim 1, wherein the light emitting layer comprises an organic material.

9. The light emitting device of claim 1, further comprising sealant to attach the first surface of the protective cap to the substrate.

10. The light emitting device of claim 1, wherein the protective cap has a thickness of 0.2 mm to 0.3 mm.

11. A light emitting device comprising:
    a substrate;
    an active area on the substrate, the active area including a first electrode, a second electrode and a light emitting layer; and
    a protective cap provided on the substrate, the protective cap including a first surface, a second surface and a connecting portion to connect the first surface and the second surface, the protective cap further including at least one groove on at least one of the first surface and the second surface, wherein the first surface, the second surface and the connecting portion substantially have a same thickness, wherein a first radius of curvature of a corner of the first surface is greater than a second radius of curvature of a corner where the first surface adjoins the connecting portion, and the first radius of curvature is greater than a third radius of curvature of a corner where the connecting portion adjoins the second surface, wherein the first radius of curvature, the second radius of curvature and the third radius of curvature are radii of curvature on a plane that is substantially parallel to a surface of the substrate on which the active area is formed.

12. The light emitting device of claim 11, wherein the protective cap further includes a second groove at another area where the connecting portion adjoins the other one of the first surface or the second surface.

13. The light emitting device of claim 11, wherein the first groove has a predetermined depth.

14. The light emitting device of claim 11, wherein the second radius of curvature is greater than 0.2 mm.

15. The light emitting device of claim 14, wherein the second radius of curvature is less than one-half of the first radius of curvature.

16. The light emitting device of claim 11, wherein the third radius of curvature is greater than 0.2 mm.

17. The light emitting device of claim 16, wherein the third radius of curvature is less than one-half of the first radius of curvature.

18. The light emitting device of claim 11, wherein the light emitting layer comprises an organic material.

19. A method of forming a light emitting device comprising:
providing a substrate;
providing an active area on the first substrate, the active area including a first electrode, a light emitting layer and a second electrode; and
providing a protective cap to enclose the active area between the protective cap and the substrate, the protective cap including a first surface, a second surface and a connecting portion that connects the first surface and the second surface, wherein the protective cap has a first radius of curvature at a corner of the first surface, a second radius of curvature at a corner where the first surface adjoins the connecting portion and a third radius of curvature at a corner where the connecting portion adjoins the second surface, the first radius of curvature being greater than the second radius of curvature and greater than the third radius of curvature, wherein the first surface, the second surface and the connecting portion substantially have a same thickness, and wherein the first radius of curvature, the second radius of curvature and the third radius of curvature are radii of curvature on a plane that is substantially parallel to a surface of the substrate on which the active area is formed.

20. The method of claim 19, further comprising providing a groove at a first area of the protective cap where the connecting portion adjoins one of the first surface or the second surface of the protective cap.

21. The method of claim 20, further comprising providing a second groove at a second area of the protective cap where the connecting portion adjoins the other one of the first surface or the second surface.

22. The method of claim 19, wherein providing the protective cap includes sealing the first surface of the protective cap to the substrate.

23. The method of claim 19, wherein the first surface, the second surface and the connecting portion are substantially formed of a same material.

24. The light emitting device of claim 1, wherein the first surface, the second surface and the connecting surface are substantially formed of a same material.

25. The light emitting device of claim 11, wherein the first surface, the second surface and the connecting portion are substantially formed of a same material.

* * * * *